United States Patent
Sevic et al.

(10) Patent No.: US 6,653,896 B2
(45) Date of Patent: Nov. 25, 2003

(54) DIFFERENTIAL RF/MICROWAVE POWER AMPLIFIER USING INDEPENDENT SYNCHRONIZED POLAR MODULATORS

(75) Inventors: John F. Sevic, Los Gatos, CA (US); Wendell B. Sander, Los Gatos, CA (US); Stephan V. Schell, San Francisco, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/997,743

(22) Filed: Nov. 30, 2001

(65) Prior Publication Data

US 2003/0102910 A1 Jun. 5, 2003

(51) Int. Cl.[7] .................................................. H03F 3/38
(52) U.S. Cl. ....................... 330/10; 330/124 R; 332/102
(58) Field of Search ................................ 330/10, 124 R; 332/102

(56) References Cited

U.S. PATENT DOCUMENTS

| | | | | |
|---|---|---|---|---|
| 3,927,379 A | * | 12/1975 | Cox et al. ...................... 330/10 |
| 5,892,395 A | * | 4/1999 | Stengel et al. ........... 330/124 R |
| 5,939,951 A | * | 8/1999 | Bateman et al. ............. 332/103 |
| 6,054,894 A | * | 4/2000 | Wright et al. ................ 330/149 |
| 6,285,251 B1 | * | 9/2001 | Dent et al. .............. 330/124 R |

* cited by examiner

Primary Examiner—Michael Tokar
Assistant Examiner—Linh Van Nguyen
(74) Attorney, Agent, or Firm—Thelen Reid & Priest LLP; Robert E. Krebs

(57) ABSTRACT

A first amplified signal is produced at a first amplifier, a second amplified signal is produced at a second amplifier, and a differential signal representing difference between the first amplified signal and the second amplified signal is generated at a subtraction unit receiving the first amplified signal and second amplified signal, the differential signal being a final amplified signal having a final modulated amplitude and a final modulated phase.

27 Claims, 6 Drawing Sheets

DIFFERENTIAL RF/MICROWAVE POWER AMPLIFIER USING INDEPENDENT SYNCHRONIZED POLAR MODULATORS

CROSS-REFERENCES TO RELATED APPLICATIONS

Not applicable.

STATEMENT AS TO RIGHTS TO INVENTIONS MADE UNDER FEDERALLY SPONSORED RESEARCH OR DEVELOPMENT

Not applicable.

REFERENCE TO A "SEQUENCE LISTING," A TABLE, OR A COMPUTER PROGRAM LISTING APPENDIX SUBMITTED ON A COMPACT DISK.

Not applicable.

BACKGROUND OF THE INVENTION

This invention relates to the amplification of communications signals, and more particularly to an improvement allowing practical processing of rapid phase changes in polar modulation signals.

Many signal modulation techniques require rapid or nearly instantaneous in the phase of signals. For example, a simple binary phase shift keying (BPSK) signal requires a 180 degree phase change of the carrier signal when the data used to modulate the carrier signal changes from one binary value to another, e.g., from "1" to "0." As a practical matter, the ability to generate and process such rapid phase changes is constrained by the finite bandwidth limitations of physical devices. In the case of polar representation signals, that is, signals expressed in terms of magnitude and phase, the generation and processing of rapid phase changes is especially challenging.

FIG. 1A illustrates an analog signal f(t) having a rapid phase change of about 180 degrees. As shown in the figure, the signal f(t) transitions from a first point 102 to a second point. The transition represents a phase change of almost 180 degrees in the signal f(t) and spans a very short period of time. Note that the phase change of nearly 180 degrees is shown here for clarity of illustration. The phase change can be less than, equal to, or greater than 180 degrees.

FIG. 1B illustrates a corresponding digital signal f(n) having a rapid phase change of about 180 degrees. Here, the signal f(n) transitions from a first point 106 to a second point 108. The transition represents a phase change of almost 180 degrees in the signal f(n) and spans very few samples of n. Specifically, only two samples, intermediate points 110 and 112, exists between the first point 106 and the second point 108. Again, the phase change of nearly 180 degrees is shown here for clarity of illustration. The phase change can be less than, equal to, or greater than 180 degrees.

FIG. 1C is a complex vector plot of the nearly instantaneous phase change in f(t). The signal f(t) can be expressed as the real part of a complex vector rotating in the complex plane, according the equations:

$$\sin wt = \frac{e^{jwt} - e^{-jwt}}{2j}$$

$$\cos wt = \frac{e^{jwt} + e^{-jwt}}{2}$$

where f(t) is sin wt, w is the instantaneous rate of phase change, and the complex vector $e^{jwt}$ rotates about the center of a real axis $\text{Re}\{e^{jwt}\}$ and imaginary axis $\text{Im}\{e^{jwt}\}$. The center is also termed the origin of the complex plane. Note that for clarity of illustration, the phase change in f(t) of almost 180 degrees is not incorporated into the above equations. However, the phase change is illustrated in the complex vector plot of FIG. 1C. Here, as the complex vector $e^{jwt}$ rotates in a counter-clockwise direction, it transitions nearly instantaneously from a first position 114, corresponding to the first point 102, to a second position 116, corresponding to the second point 104.

An angle 118 formed between the first position 114 and the second position 116 represents the phase change of almost 180 degrees. This change of phase occurs in a very short period of time. In a polar representation system, where a signal is expressed in terms of magnitude and phase, the expression of phase experiences a nearly instantaneous change corresponding to the angle 118. Such a rapid change in the value of the phase expression is associated with a correspondingly wide bandwidth. The shorter the period over which the phase change occurs, the wider the associated bandwidth becomes.

In addition, the trajectory followed by the complex vector $e^{jwt}$ in its transition from the first position 114 to the second position 116 can dramatically increase the severity of rapid phase change even further. Under certain conditions, the trajectory followed by the complex vector $e^{jwt}$ as it transitions from the first position 114 to the second position 116 is one that passes near the origin of the complex plane. The phase change experienced by the complex vector $e^{jwt}$ increases sharply as the trajectory nears the origin of the complex plane. Although this situation can occur in both analog and digital signal, it is more easily illustrated in the context of a digital signal. Therefore, it is explained below using the example of the digital signal f(n).

FIG. 1D is a complex vector plot of the nearly instantaneous phase change in f(n). The relationship of the signal f(n) to the complex vector plot shown in FIG. 1D is analogous to the relations already described between the signal f(t) and the complex vector plot shown in 1C. Here, a complex vector $e^{jwn}$, in the form of discrete samples, rotates in a counter-clockwise direction in the complex plane. The complex vector $e^{jwn}$ transitions nearly instantaneously from a first position 120, corresponding to the first point 106, to a second position 122, corresponding to the second point 108.

The trajectory traced by the endpoint of the complex vector $e^{jwn}$ (the signal point) over time is of considerable interest in communications engineering (one end of all vectors is at the origin). For bandlimited signals, which includes nearly all signals of practical interest, the speed of the signal point along its trajectory is upper bounded. Sampled points of this trajectory are represented in FIG. 1D by intermediate positions 124 and 126, which correspond respectively to intermediate points 110 and 112 of FIG. 1B.

Should this trajectory pass near the origin, the polar coordinates of the signal point can change quite rapidly indeed. As seen in FIG. 1D, even though the direct distances between the signal points of complex vectors 120, 124, 126, and 122 respectively are nearly uniform, the angles subtended between adjacent vectors, and the magnitude changes between adjacent vectors, can change markedly. Note that the closer such a trajectory passes to the origin, the greater the associated phase change of the signal during this near approach.

FIG. 2A is a vector transition diagram of a representative bandlimited signal. Note that there are numerous transitions near to the origin, some of which transition very close to the origin. FIG. 2B is a plot of the power spectral density (PSD) of the phase change of the signal shown in FIG. 2A. Note that the PSD does not roll off very fast with increasing frequency, showing that there is a large amount of high frequency content in the phase changes of this signal. Such high frequency energy is due to the rapid phase changes whenever the signal trajectory passes nearby the origin. Representation of this type of signal directly using polar coordinates requires devices having correspondingly wide bandwidths. This 'bandwidth expansion' is a point of difficulty in the use of polar modulation. This can be contrasted with the signal shown in FIG. 6. No trajectory of this signal passes near to the origin, and the corresponding PSD of the signal phase changes shows a marked rolloff with increasing frequency.

A need exists to provide an alternative approach to direct polar modulation, such that the large phase changes of signals having trajectories passing near to the origin do not require the application of devices with large bandwidth capability.

It is important to differentiate the present invention from earlier multiple amplifier approaches, such as LINC [ref: U.S. Pat. No. 4,178,557, entitled "Linear Amplification With Nonlinear Devices" (P. Henry), issued Dec. 11, 1979] and Doherty [ref: U.S. Pat. No. 5,420,541, entitled "Microwave Doherty Amplifier" (D. Upton, et.al.) issued May 30, 1995]. Specifically the LINC technique, generally, decomposes the input signal into two constant-magnitude signals, and uses phase modulation techniques on both signal components to effect AM and PM on the final output signal which is the sum of the two component signals. The Doherty technique, generally, uses two amplifiers operating on the same signal, but with an offset such that when the first amplifier (sized too small to obtain improved efficiency) goes into compression, the second amplifier begins contributing to the output power. This additional power contribution must be sufficient to result in a correct output signal, which again is the sum of the two amplifier outputs. The present invention does not contain any of the above techniques.

BRIEF SUMMARY OF THE INVENTION

According to the invention, a first amplified signal is produced at a first amplifier, a second amplified signal is produced at a second amplifier, and a differential signal representing difference between the first amplified signal and the second amplified signal is generated at a subtraction unit receiving the first amplified signal and second amplified signal. The differential signal may be a final amplified polar modulation signal having a final modulated amplitude and a final modulated phase.

In a specific embodiment, a control unit generates control signals controlling a first amplitude modulator providing a first amplitude modulated signal, a first phase modulator providing a first phase modulated signal, a second amplitude modulator providing a second amplitude modulated signal, and a second phase modulator providing a second phase modulated signal. The first amplitude modulated signal and first phase modulated signal are provided to a first amplifier, which produces the first amplified signal. The second amplitude modulated signal and second phase modulated signals are provided to a second amplifier, which produces the second amplified signal.

DETAILED DESCRIPTION OF THE INVENTION

Figure 1A:
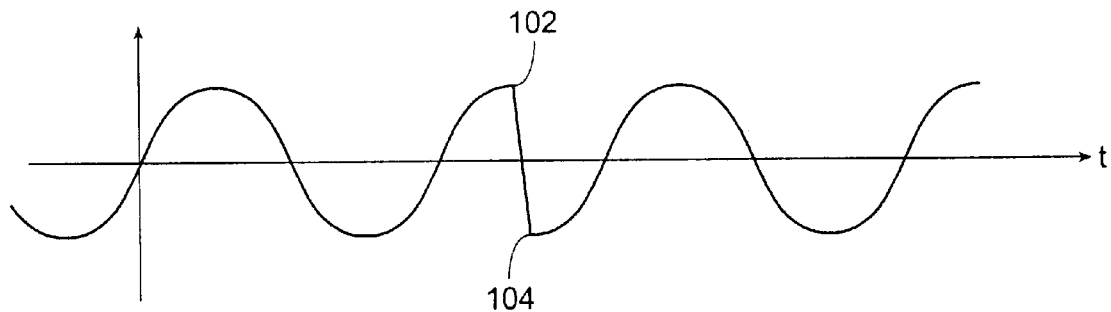
FIG. 1A illustrates an analog signal f(t) having a rapid phase change of about 180 degrees.
Figure 1B:
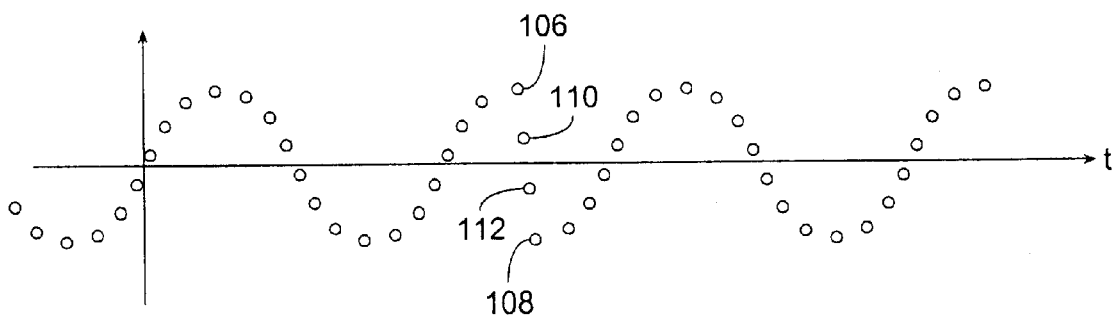
FIG. 1B illustrates a corresponding digital signal f(n) having a rapid phase change of about 180 degrees.
Figure 1C:
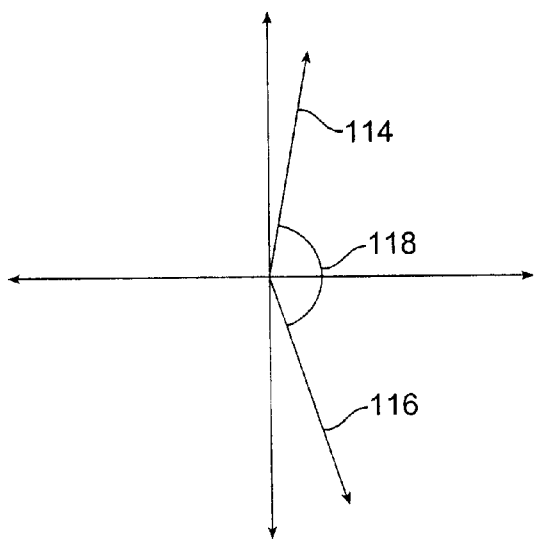
FIG. 1C is a complex vector plot of the nearly instantaneous phase change in f(t).
Figure 1D:
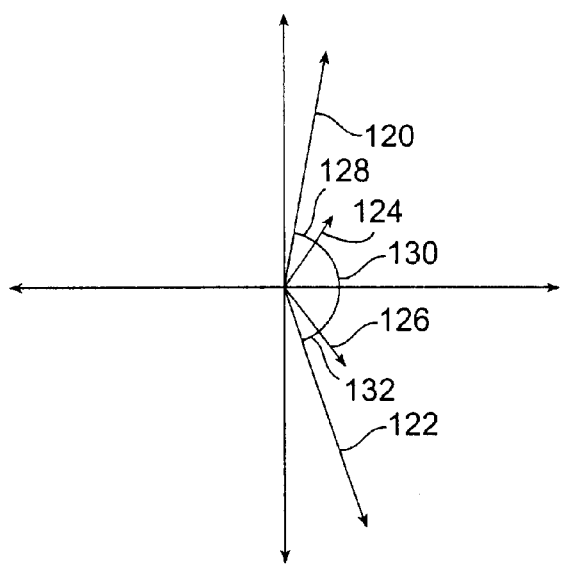
FIG. 1D is a complex vector plot of the nearly instantaneous phase change in f(n).
Figure 2A:
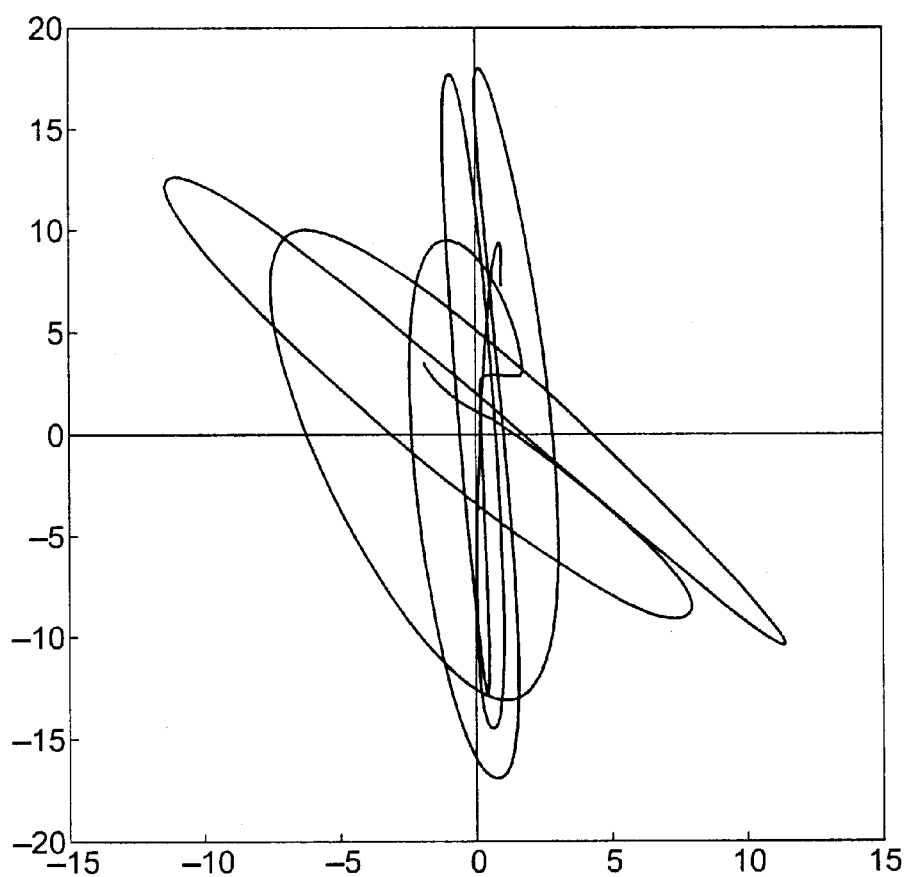
FIG. 2A is a constellation diagram of a signal that passes near or through the origin of the complex plane.
Figure 2B:
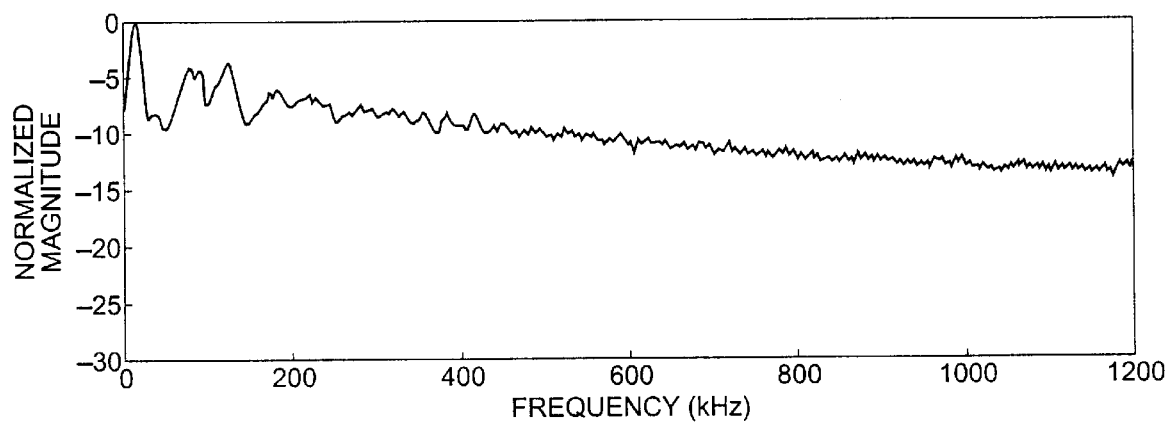
FIG. 2B is a plot of the power spectral density (PSD) of the instantaneous phase change of the signal shown in FIG. 2A.
Figure 3A:
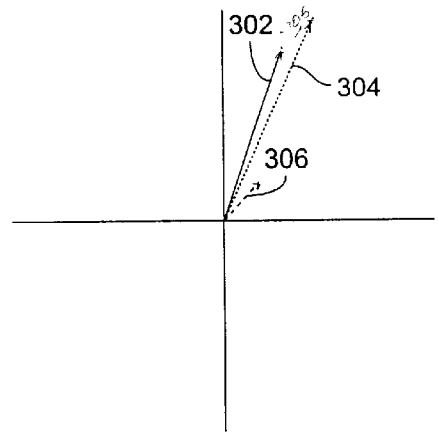
FIG. 3A is a complex vector plot at time $t_1$ of a signal, represented as the difference between two other signals.
Figure 3B:
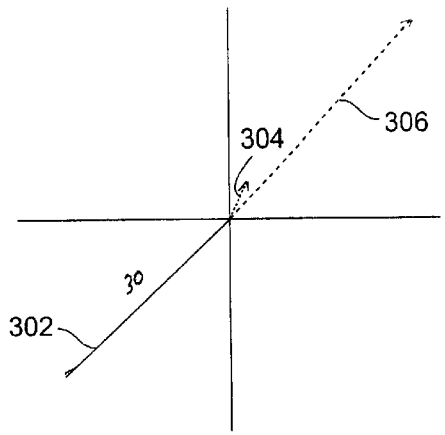
FIG. 3B is a complex vector plot at time $t_2$ of the same signals as shown in FIG. 3A, illustrating the use of differential combining to achieve a rapid phase change.

By representing a signal as the difference between two separate signals, rapid phase changes in communications signals can be practically implemented. FIG. 3A is a complex vector plot at time $t_1$ of a signal 302, represented as the difference between two other signals 304 and 306. That is, the signal 302 can be formed by subtracting the signal 306 from the signal 304. FIG. 3B is a complex vector plot at time $t_2$, which closely follows $t_1$, of the same signals 302, 304, and 306. As shown in FIG. 3B, the signal 302 has experienced a significant change in phase (or angle) from its original position in FIG. 3A. However, the signals 304 and 306 have not experienced any phase change from their original positions in FIG. 3A. In fact, the signals 304 and 306 have merely changed in amplitude. By representing the signal 302 as the difference between the signals 304 and 306, a nearly instantaneous phase change in the signal 302 is achieved. In this example, it is done by merely modulating the individual amplitudes of the signals 304 and 306.

Figure 4A:
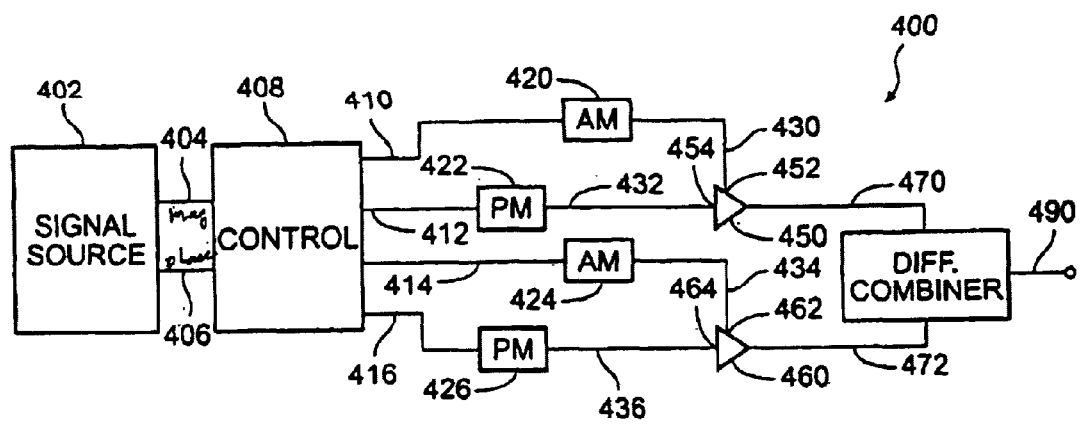
FIG. 4A is a block diagram of a differential power amplifier unit 400 producing an amplified polar modulation signal in accordance with one embodiment of the present invention.

FIG. 4A is a block diagram of a differential power amplifier unit 400 producing an amplified signal 490 in accordance with one embodiment of the present invention. An input signal source 402 provides to a control unit 408 an input signal that is to be amplified. As shown in the figure, the input signal source 402 provides the input signal in the polar form of an input amplitude control signal 404 and an input phase control signal 406 to the control unit 408. The input amplitude control signal 404 and the input phase control signal 406 can be digital or analog. Although not shown, the input signal can be provided to the control unit 408 in other forms. For example, the input signal can be in the form of a combined signal containing both a modulated amplitude and a modulated phase provided to the control unit 408.

The control unit 408 receives the input amplitude control signal 404 and the phase control signal 406 and produces a first amplitude control signal 410, a first phase control signal 412, a second amplitude control signal 414, and a second phase control signal 416. The control unit 408 produces these four control signals such that the input signal is expressed as the difference between a first signal (represented by the first amplitude control signal 410 and the first phase control signal 412) and a second signal (represented by the second amplitude control signal 414 and the second phase control signal 416). At this point, the first and second signals may only be virtual signals that do not physically exist except as they are represented by the four control signals. In any case, the control unit 408 is capable of producing the four control signals as to effectuate such a mapping of the input signal into two distinct signals whose difference represent the input signal.

The control unit 408 can be implemented in a wide variety of ways. Note that there may be more than one pair of distinct signals whose difference represents the input signal. Thus, depending on the particular implementation, the control unit 408 may or may not express a particular input signal using the same pair of first and second modulation signals, as represented by the four control signals. Also, the control unit 408 may be a purely digital device receiving the input amplitude control signal 404 and the input phase control signal 406 in digital form, performing a digital computation (s) or look-up step(s), and producing the first amplitude control signal 410, first phase control signal 412, second amplitude control signal 414, and second phase control signal 416 in digital form. Alternatively, the control unit 408 may be implemented entirely or partially in analog form.

A first amplitude modulator 420, first phase modulator 422, second amplitude modulator 424, and a second phase modulator 426 receive the first amplitude control signal 410, first phase control signal 412, second amplitude control signal 414, and second phase control signal 416, respectively. Each of the first and second amplitude modulators 420 and 424 may be implemented using a Variable Gain Amplifier (VGA), but there may be other implementations. Each of the first and second phase modulators 422 and 426 may be implemented using a Voltage Controlled Oscillator (VCO) (as described for example in U.S. Pat. No. 6,094,101 of the present assignee, incorporated herein by reference), but there may be other implementations here as well. The first amplitude modulator 420 generates a first amplitude modulated (AM) signal 430. The first phase modulator 422 generates a first phase modulated (PM) signal 432. The second amplitude modulator 424 generates a second AM signal 434. The second phase modulator 426 generates a second PM signal 436.

A first power amplifier 450 and a second power amplifier 460 generate a pair of independent, synchronized, and amplified signals 470 and 472 that are differentially combined to form the amplified signal 490. Specifically, the first AM signal 430 is received at a power supply terminal 452 of the first the power amplifier 450. The first PM signal 432 is received at a signal input terminal 454 of the first power amplifier 450. The first power amplifier 450 generates a first amplified signal 470 having a modulated amplitude corresponding to the first AM signal 430 and a modulated phase corresponding to the first PM signal 432.

Similarly, the second AM signal 434 is received at a power supply terminal 462 of the second power amplifier 460. The second PM signal 436 is received at a signal input terminal 464 of the second power amplifier 460. The second power amplifier 460 generates a second amplified signal 472 having a modulated amplitude corresponding to the second AM signal 434 and a modulated phase corresponding to the second PM signal 436.

Alternatively, a first combined amplitude and phase modulated (AM/PM) signal (not shown) can be inputted to a single terminal of the first power amplifier 450, and a second combined AM/PM signal (not shown) can be inputted to a single terminal of the second power amplifier 460. This particular implementation would provide both the amplitude component and the phase component as a combined input on one terminal of the power amplifier 450, instead of providing them separately on a power supply terminal and a signal input terminal of the power amplifier 450 as previously discussed. For example, the first phase modulator 422 and the first amplitude modulator 420, both still under the control of the control unit 408, can be placed in parallel to generate such a first combined AM/PM. A similar configuration can be used to provide a second combined AM/PM signal to the second power amplifier 460.

Thus, the first and second amplified signals 470 and 472 are independently yet synchronously controlled by the control unit 408, through the first amplitude modulator 420, the first phase modulator 422, the second amplitude modulator 424, the second phase modulator 426, the first power amplifier 450, second power amplifier 460, and the various interconnecting signals.

A differential combiner 480 receives the first and second amplified signals 470 and 472 and performs differential combination of the two signals to produce a differential output that is the amplified signal 490. Since the first and second amplified signals 470 and 472 are independently and synchronously controlled by the control unit 408 such that their difference signal corresponds to the input amplitude control signal 404 and an input phase control signal 406 representing the original input signal to be amplified, the differential output 490 of the differential combiner is an amplified version of the original input signal.

Figure 4B:
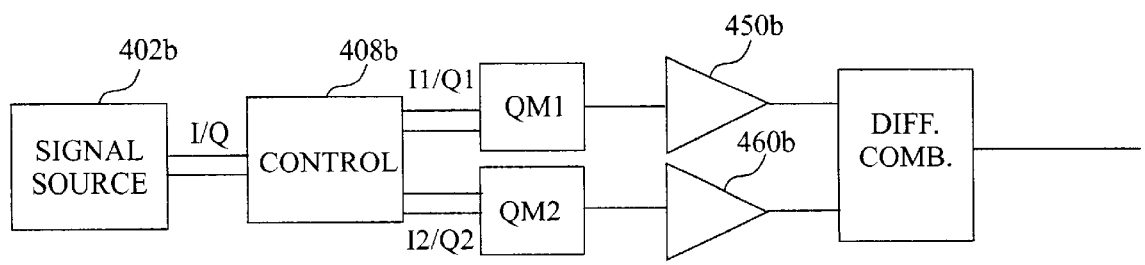
FIG. 4B is a block diagram of a differential power amplifier unit 400 producing an amplified signal in accordance with another embodiment of the present invention.
Figure 4C:
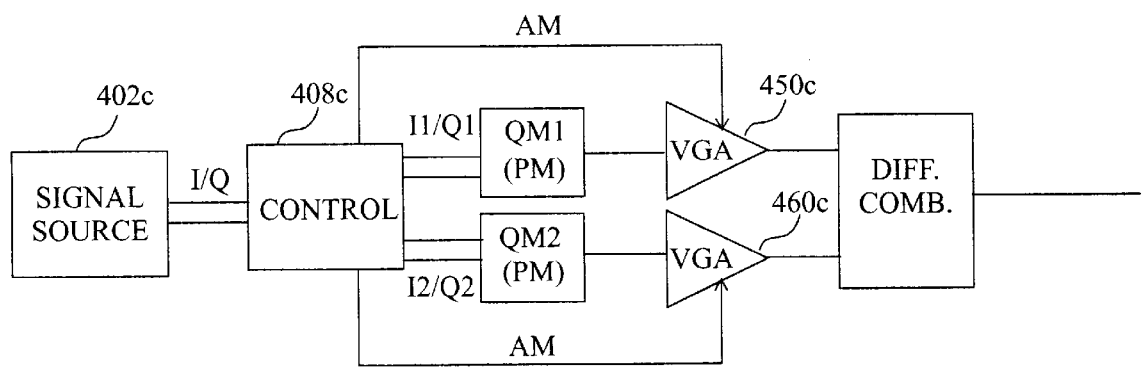
FIG. 4C is a block diagram of a differential power amplifier unit 400 producing an amplified signal in accordance with still another embodiment of the present invention.

Other embodiments may use I/Q modulation. Referring to FIG. 4B, an input signal source 402b provides to a control unit 408b an input signal in I/Q form that is to be amplified. The control unit 408b in response produces two signals, $I_1/Q_1$ and $I_2/Q_2$, which are applied to respective quadrature modulators $QM_1$ and $QM_2$. Output signals of the quadrature modulators are amplified in respective amplifiers 450b and 460b and combined in the differential combiner to form the final output signal. Alternatively, as shown in FIG. 4C, the amplifiers 450c and 460c may be variable gain amplifiers (VGAs), controlled by the controller 408c. In this embodiment, the quadrature modulators $QM_1$ and $QM_2$ perform phase modulator only, with amplitude modulation being performed by the VGAs. Again, output signals of the respective amplifiers 450c and 460c are combined in the differential combiner to form the final output signal.

Figure 5A:
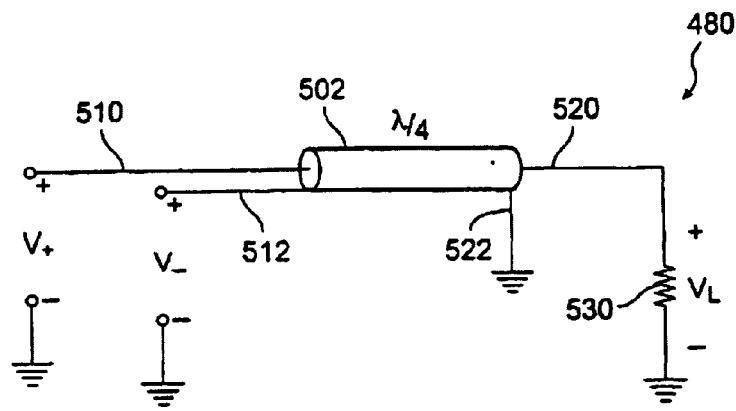
FIG. 5A illustrates a transmission line balun implementation of the differential amplifier.

FIG. 5A illustrates a transmission line balun implementation of the differential combiner 480. A quarter-wave transmission line 502 (relative to the frequency of the first and second signals 470 and 472) has first and second input 510 and 512, as well as first and second output 520 and 522. The first signal 470 is applied as a signal $V_+$ across the first input 510 and ground. The second signal 472 is applied as a signal $V_-$ across the second input 512 and ground. The second output 522 is connected to ground. The first output 520 is connected to one end of a load 530. The other end of the load 530 is connected to ground. The quarter-wave transmission line 502 produces a signal $V_L$ across the load 530 such that $V_L$ represents the voltage difference between $V_+$ and $V_-$ ($V_L=V_+-V_-$). Thus, the amplified signal 490 is produced as the signal $V_L$, representing the voltage difference between first a signal 470 and second signal 472.

Figure 5B:
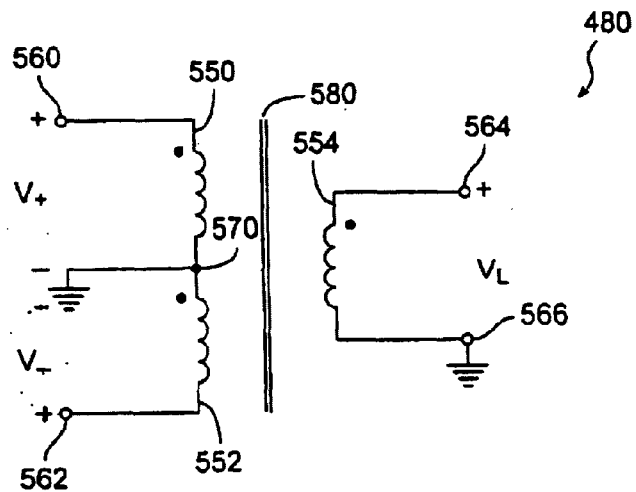
FIG. 5B illustrates a transformer balun implementation of the differential amplifier 480.

FIG. 5B illustrates a transformer balun implementation of the differential amplifier 480. A transformer structure is formed by a first, second, and third inductor 550, 552, and 554. A first input 560 is connected to one end of the first inductor 550. The other end of the first inductor 550 is connected to a node 570, which is connected to ground. The node 570 is also connected to one end of the second inductor 552. The other end of the second inductor 552 is connected to a second input 562. The first and second inductors 550 and 552, thus serially connected, are coupled by electromagnetic fields to the third inductor 554. There may or may not be a coupling element 580 affecting this coupling. A first output 564 is connected to one end of the third inductor 554. The other end of the third inductor 564 is connected to a second output 566, which is connected to ground.

The first signal 470 is applied as a signal $V_+$ across the first input 560 and the node 570. The second signal 472 is applied as a signal $V_-$ across the node 570 and the second input 562. This structure produces a signal $V_L$ across the first output 564 and the second output 566 such that $V_L$ represents the voltage difference between $V_+$ and $V_-$ ($V_L = V_+ - V_-$). The amplified signal 490 is produced as the signal $V_L$, representing the voltage difference between first signal 470 and second signal 472.

Figure 6A:
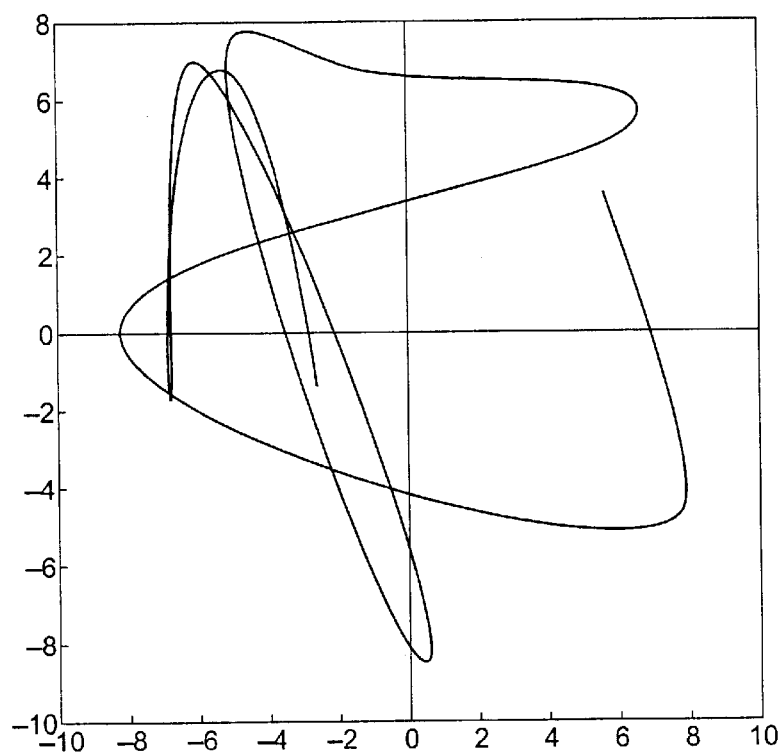
FIG. 6A is a constellation diagram of a signal that does not pass near or through the origin of the complex plane.
Figure 6B:
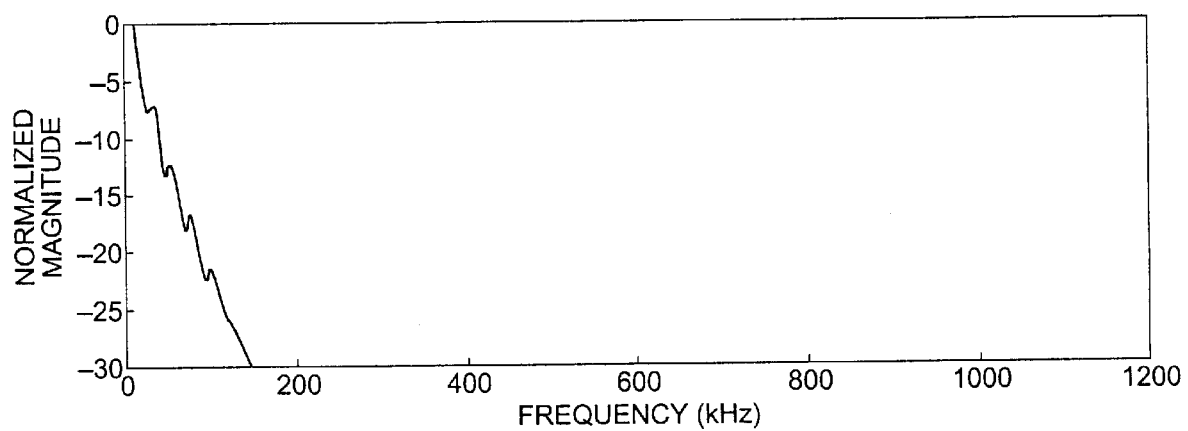
FIG. 6B is a plot of the power spectral density (PSD) of the instantaneous phase change of the signal shown in FIG. 6A.

FIG. 6A is a constellation diagram of a signal that does not pass near or through the origin of the complex plane. The differential power amplifier unit 400 represents a signal as the difference between separate signals that do not experience rapid phase changes. In a signal that does not experience such rapid phase changes, the trajectory of phase change is not likely to pass near or through the origin of the complex plane, as illustrated in FIG. 6A. FIG. 6B is a plot of the power spectral density (PSD) of the instantaneous phase change of the signal shown in FIG. 6A. Note that the PSD shown rolls off. That is, the PSD does not contain high-frequency energy. Therefore, such a signal can be processed using practical devices having limited bandwidths. Consequently, rapid phase change can be effectively and practically achieved.

Although the present invention has been described in terms of specific embodiments, it should be apparent to those skilled in the art that the scope of the present invention is not limited to the described specific embodiments.

The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claim.

What is claimed is:

1. A method for generating an amplified signal, the method comprising:
    producing a first amplified signal at a first amplifier,
    producing a second amplified signal at a second amplifier, wherein at one time one of the first amplified signal and the second amplified signal has a greater magnitude than the other, and at another time, a different one of the first amplified signal and the second amplified signal has a greater magnitude than the other, and
    at a subtraction unit receiving said first amplified signal and second amplified signal, generating a differential signal representing difference between said first amplified signal and said second amplified signal, said differential signal being a final amplified signal having a final modulated amplitude and a final modulated phase.

2. The method of claim 1 wherein said first amplified signal is a signal having a first modulated amplitude and first modulated phase, and wherein said second amplified signal is a signal having a second modulated amplitude and second modulated phase.

3. The method of claim 2,
    wherein the step of producing said first amplified signal further comprises the steps of:
        providing a first amplitude modulated (AM) signal to a first terminal of said first amplifier; and
        providing a first phase modulated (PM) signal to a second terminal of said first amplifier,
    and wherein the step of producing said second amplified signal further comprises the steps of:
        providing a second AM signal to a first terminal of said second amplifier; and
        providing a second PM signal to a second terminal of said second amplifier.

4. The method of claim 3, wherein said first AM signal, first PM signal, second AM signal, and second PM signal are produced at a first amplitude modulator, first phase modulator, second amplitude modulator, and second phase modulator, respectively.

5. The method of claim 2,
    wherein the step of producing said first amplified signal at said first amplifier further comprises the step of:
        providing a first amplitude and phase modulated (AM/PM) signal to a terminal of said first amplifier,
    and wherein the step of producing said second amplified signal at said second amplifier further comprises the step of:
        providing a second AM/PM signal to a terminal of said second amplifier.

6. The method of claim 5, wherein said first AM/PM signal is produced using a first amplitude modulator and a first phase modulator, and wherein said second AM/PM signal is produced using a second amplitude modulator and a second phase modulator.

7. The method of claim 4 or 6, wherein at least one of said first and second phase modulators comprises a voltage controlled oscillator (VCO).

8. The method of claim 4 or 6, wherein at least one of said first and second amplitude modulators comprises a variable gain amplifier (VGA).

9. The method of claim 4 or 6 further comprising the step of:
    controlling said first amplitude modulator, first phase modulator, second amplitude modulator, and second phase modulator using control signals generated at a control unit receiving at least one input signal representing said final amplified signal.

10. The method of claim 9, said controlling step further comprising:
    based on said input signal, performing vector calculation or lookup to generate said first amplitude control signal, first phase control signal, second amplitude control signal, and second phase control signal.

11. The method of claim 1, wherein said subtraction unit comprises a transmission balun.

12. The method of claim 1, wherein said subtraction unit comprises a lump balun.

13. An apparatus for generating an amplified signal comprising:
    a first amplifier producing a first amplified signal;
    a second amplifier producing a second amplified signal; and
    a subtraction unit receiving connected with said first and second amplifiers and receiving said first and second amplified signals, said subtraction unit generating a differential signal representing difference between said first and second amplified signals, said differential signal being a final amplified signal having a final modulated amplitude and a final modulated phase;

wherein at one time one of the first amplified signal and the second amplified signal has a greater magnitude than the other, and at another time, a different one of the first amplified signal and the second amplified signal has a greater magnitude than be other.

14. The apparatus of claim 13 wherein said first amplified signal is a signal having a first modulated amplitude and first modulated phase, and wherein said second amplified signal is a signal having a second modulated amplitude and second modulated phase.

15. The apparatus of claim 14,
wherein said first amplifier includes:
a first terminal receiving a first amplitude modulated (AM) signal and
a second terminal receiving a first phase modulated (PM) signal,
and wherein said second amplifier includes:
a first terminal receiving a second AM signal; and
a second terminal receiving a second PM signal.

16. The apparatus of claim 15 further comprising:
a first amplitude modulator connected with said first terminal of said first amplifier and generating said first AM signal;
a first phase modulator connected with said second terminal of said first amplifier and generating said first PM signal;
a second amplitude modulator connected with said first terminal of said second amplifier and generating said second AM signal, and
a second phase modulator connected with said second terminal of said second amplifier and generating said second PM signal.

17. The apparatus of claim 14, wherein said first amplifier includes a terminal receiving a first amplitude and phase modulated (AM/PM) signal, and wherein said second amplifier includes a terminal receiving a second AM/PM signal.

18. The apparatus of claim 17 further comprising:
a first amplitude modulator;
a first phase modulator, said first amplitude modulator and first phase modulator being connected to said terminal of said first amplifier and generating said first AM/PM signal;
a second amplitude modulator; and
a second phase modulator, said second phase modulator and second phase modulator being connected to said terminal of said second amplifier and generating said second AM/PM signal.

19. The apparatus of claim 16 or 18, wherein at least one of said first and second phase modulators comprises a voltage controlled oscillator (VCO).

20. The apparatus of claim 16 or 18, wherein at least one of said first and second amplitude modulators comprises a variable gain amplifier (VGA).

21. The apparatus of claim 16 or 18 further comprising:
a control unit receiving at least one input signal representing said final amplified signal and generating control signals for controlling said first amplitude modulator, first phase modulator, second amplitude modulator, and second phase modulator.

22. The apparatus of claim 21, wherein said control unit performs vector calculation or lookup to generate said control signals.

23. The apparatus of claim 13, wherein said subtraction unit composes a transmission balun.

24. The apparatus of claim 13, wherein said subtraction unit comprises a lump balun.

25. A system for generating an amplified signal, comprising:
means for producing a first amplified signal at a first amplifier;
means for producing a second amplified signal at a second amplifier;
means for generating a differential signal representing difference between said first amplified signal and said second amplified signal, said differential signal being a final amplified signal having a final modulated amplitude and a final modulated phase;
wherein at one time one of the first amplified signal and the second amplified signal has a greater magnitude than the other, and at another time, a different one of the first amplified signal and the second amplified signal has a greater magnitude than the other.

26. A method of forming a communications signal, comprising:
forming a first modulated signal component;
forming a second modulated signal component;
combining the first modulated signal component and second modulated signal component to form as the communications signal a difference between the first modulated signal component and second modulated signal component; and
transmitting the communications signal;
wherein at one time one of the first modulated signal component and the second modulated signal component has a greater magnitude than the other, and at another time, a different one of the first modulated signal component and the second modulated signal component has a greater magnitude than the other.

27. An apparatus for forming a communications signal, comprising:
means for a modulated signal component;
means for forming a second modulated signal component;
means for combining the first modulated signal component and second modulated signal component to form as the communications signal a difference between the first modulated signal component and second modulated signal component; and
means for transmitting the communications signal;
wherein at one time one of the first modulated signal component and the second modulated signal component has a greater magnitude than the other, and at another time, a different one of the first modulated signal component and the second modulated signal component has a greater magnitude than the other.

* * * * *

UNITED STATES PATENT AND TRADEMARK OFFICE
CERTIFICATE OF CORRECTION

PATENT NO. : 6,653,896 B2
DATED : November 25, 2003
INVENTOR(S) : John F. Sevic, Wendell B. Sander and Stephan V. Schell It is certified that error appears in the above-identified patent and that said Letters Patent is hereby corrected as shown below:

Column 1,
Line 31, after "instantaneous" insert -- changes --.
Line 45, after "point" insert -- 104 --.

Column 4,
Line 29, replace "amplifier" with -- combiner --.

Column 9,
Line 5, replace "be" with -- the --.

Column 10,
Line 42, after "for" insert -- forming --.
Line 42, after "a" insert -- first --.

Signed and Sealed this

Sixteenth Day of March, 2004

JON W. DUDAS
*Acting Director of the United States Patent and Trademark Office*